United States Patent [19]

Gazit et al.

[11] Patent Number: 4,997,702
[45] Date of Patent: Mar. 5, 1991

[54] SHAPE RETAINING FLEXIBLE ELECTRICAL CIRCUIT

[75] Inventors: Samuel Gazit, West Hartford; Gary W. Adams, Rogers, both of Conn.

[73] Assignee: Rogers Corporation, Rogers, Conn.

[21] Appl. No.: 475,454

[22] Filed: Feb. 6, 1990

Related U.S. Application Data

[63] Continuation-in-part of Ser. No. 319,488, Mar. 6, 1989, abandoned.

[51] Int. Cl.$^5$ ............... B32B 15/08; B32B 15/14; B32B 15/16; H05K 1/03
[52] U.S. Cl. .................... 428/283; 174/254; 361/398; 361/411; 428/209; 428/285; 428/290; 428/901
[58] Field of Search ............. 361/398, 411; 428/290, 428/209, 285, 901, 283; 174/68.5

[56] References Cited

U.S. PATENT DOCUMENTS 4,883,708  11/1989  Kariya et al. .................. 428/263
4,913,955   4/1990  Noda et al. .................... 428/236

OTHER PUBLICATIONS

Gurley, Steve, Flexible Circuits: Design and Applications, Marcel Depper Inc., New York (1984), 124–125.

Primary Examiner—James C. Cannon
Attorney, Agent, or Firm—Fishman, Dionne & Cantor

[57] ABSTRACT

A printed circuit board composed of an epoxy impregnated nonwoven web substrate laminated to electrically conductive sheets is presented. The printed circuit board is flexible in the sense that it can be bent to any desired multiplanar shape and will retain that shape after installation as required by electronic interconnection systems. The printed circuit board also has improved thermal properties achieved through the addition of up to 70% by weight of low coefficient of thermal expansion (CTE) particulate fillers and/or the use of thermally stable reinforcement fibers in the nonwoven web.

10 Claims, 4 Drawing Sheets

SHAPE RETAINING FLEXIBLE ELECTRICAL CIRCUIT

CROSS REFERENCE TO RELATED APPLICATION

This is a continuation-in-part Application of U.S. application Ser. No. 319,488 filed Mar. 6, 1989, and now abandoned.

BACKGROUND OF THE INVENTION

This invention relates to the field of printed circuit boards. More particularly, this invention relates to printed circuit boards having a fiber reinforced substrate which can be processed in a manner similar to rigid printed circuit board or hardboards but thereafter are bendable to retain multiplanar shapes.

The process for manufacturing a rigid printed circuit board or hardboard is well known in the art. The hardboard is produced in a panel form with the particular circuitry being etched, plated, screened or stamped thereon. Rigid printed circuit board of this type must necessarily only be used for single-plane hardboard applications since any bending would result in cracking and/or breaking.

In order to connect single-plane hardboards to other hardboards within the electronic device, expensive multiboard interconnections must be utilized. These interconnectors add both to parts costs and labor costs as well as increasing the complexity of a given installation. Multiplane circuitry can be achieved by:
1. Combinations of two or more rigid board segments interconnected by flexible jumper cables.
2. The mother-daughter board arrangement, using edge card connectors and,
3. Building a flexible circuit which is then selectively stiffened in sections which are designed for component mounting.

The above-discussed well known problems of building multiplanar circuits with both conventional rigid and flexible circuit boards have been overcome and alleviated by a novel bendable, shape retaining circuit board material described in U.S. Ser. No. 778,603 filed Sept. 20, 1985, which is assigned to the assignee hereof, all of the contents of which are incorporated herein by reference. This material is commercially available from Rogers Corporation, Rogers, Connecticut under the trademark BEND/flex. The circuit board material of prior U.S. Ser. No. 778,603 is made utilizing conventional hardboard processes. The circuit board is produced in sheet form, and can be converted into a printed circuit by using conventional hardboard processing techniques including component mounting. Thereafter, the unique properties of the prior material allow the printed circuit board to be formed into a predetermined three dimensional shape and thereafter mounted into electronic equipment. The formed printed circuit board will not crack and has sufficient stiffness to retain its shape after installation.

The manufacturing process of the circuit material of U.S. Ser. No. 778,603 includes forming a nonwoven web substrate of polyester and glass fibers, impregnating and saturating the web with an epoxy solution, and thereafter drying the web to drive off any solvent. The dry, tacky web is then laminated on one or both sides with sheets of copper to form a sheet of printed circuit board material. As with hardboard material, the sheet can be etched, punched, drilled or blanked out to form any desired circuit configuration and finally, the circuit with the mounted components can be formed or bent into a multiplanar configuration.

An important feature of the circuit material of U.S. Ser. No. 778,603 is its bendability and shape retention at room temperature. This key feature is achieved by carefully selecting the epoxy resin to exhibit a glass transition temperature (Tg) at or near room temperature. The Tg is typically in the range of 10-60° C. and preferably about 40-50° C. This glass transition is broad and spreads over 20-30° C. In addition to the epoxy matrix and nonwoven fabric web of glass and polyester fibers, the commercial bendable composite also includes flame retardant fillers.

As stated, the formable/bendable circuit material described above can be used to solve the problem of multiplane interconnections at a relatively lower cost than conventional techniques. In concept, portions of the bendable board function as the rigid segments while other portions of the same board function as the "flexible" interconnections in a multiplane configuration.

While well suited for its intended purposes, the circuit material of U.S. Ser. No. 778,603 does suffer from several problems related to its thermal properties including a perceived need for both improved plated through hole reliability and improved heat resistance. The circuit material of U.S. Ser. No. 778,603 has a coefficient of thermal expansion (CTE) in the Z-direction above the glass transition temperature of about 300-400ppm/°C. which limits the plated through hole reliability of the laminate in double clad circuit applications.

Also, the circuit material of U.S. Ser. No. 778,603 is comprised of polyester fibers which melt near standard solder reflow temperatures (250-260° C.) This may cause the prior art bendable circuit material to suffer from surface blistering and bulk structural fusion of the fibers' network during solder reflow processing.

SUMMARY OF THE INVENTION

The above-discussed and other problems and deficiencies of the prior art are overcome or alleviated by the improved bendable and shape retaining circuit board material of the present invention. In accordance with the present invention, the circuit material of U.S. Ser. No. 778,603 is modified to contain up to 70% by weight of low CTE fillers and/or an additional weight fraction of higher melting point fiber reinforcement to improve the overall thermal properties of the material. As a result, the prior art problem of limited plated through hole reliability due to low CTE in the Z axis is improved by filling the circuit substrate (comprised of a non-woven web impregnated with epoxy) with low CTE particles such as glass spheres, silica or milled microglass fibers in a preferred filling range of about 20-50% by weight.

In addition, the prior art problem of limited heat resistance at solder reflow temperatures is alleviated by replacing the polyester component in the non-woven fabric web with a more thermally stable fiber such as an aromatic polyamide, a polyacrylonitrile or a similar polymeric fiber. The resultant circuit material will then easily withstand temperatures typical to the solder reflow process without deleterious effects.

The above-discussed and other features and advantages of the present invention will be appreciated and understood by those of ordinary skill in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

The circuit board of prior U.S Ser. No. 778,603 includes a fiber reinforced substrate laminated between one or more electrically conductive sheets. The substrate is made of a nonwoven blend of polyester and glass fibers forming a fabric web. This nonwoven web is thereafter saturated with an epoxy resin thus forming a polymer impregnated nonwoven web.

More particularly, the commercial laminate of U.S. Ser. No. 778,603 (sold under the trademark BEND/-flex) is composed of an epoxy matrix, flame retardant compounds, and a nonwoven fabric reinforcement laminated with copper on one or both sides. The nonwoven reinforcement is composed of E glass staple fibers (0-100 weight %, 10-30 weight % preferred) with the balance of the nonwoven web composed of polyethylene terephthalate staple fibers such as Hoechst Celanese TREVIRA or DuPont DACRON fibers. The prior art composite contains 5-75 weight % nonwoven (20-40 weight % preferred) with the balance of the composite composed of a crosslinked epoxy resin and flame retardant compounds.

The flame retardant compounds used in the prior art are brominated organic compounds which comprise 5-50 weight % (20-30 weight % preferred) of the epoxy resin portion of the composite (including the weight of the fillers). The brominated organic compounds have good electrical properties and exhibit good thermal stability. The brominated fillers may be either solid or liquid. Decabromo-diphenyl oxide, pentabromo-diphenyl oxide, bis (2,3 dibromopropyl ether) of tetrabromobesphenol A, monofunctional brominated glycidyl ether, brominated imides such as ethylene bis tetrabromophthalimide and brominated di functional epoxy compounds are typical examples of this class of flame retardant chemicals. The flame retardant system is more effective if a synergistic antimony compound is also included as a filler. The quantity of the synergistic compound (such as antimony trioxide or antimony pentoxide) should be such that the molar ratio of bromine to antimony is between 1:1 and 5:1 (2:1-3:1 preferred).

The epoxy resin portion of the prior art composite is formed by reacting a multifunctional epoxy, a monofunctional epoxy and an anhydride or diacid. Typical multifunctional epoxies are glycidyl ethers of phenolic novolacs, glycidyl ethers of tetra phenylol ethane, or triglycidyl ethers of tris(hydroxy phenyl) methane and its isomers or oligomers.

Examples of monofunctional epoxies are aromatic or aliphatic glycidyl ethers and dibromo-phenyl glycidyl ether, all of which will function to lower the composite Tg. Room temperature bendability may also be achieved by including aliphatic diglycidyl ethers in the formulation. Typical anhydrides which may be used are: dodecenyl succinic, hexahydrophthalic, NADIC methyl, phthalic, succinic, tetrahydrophthalic, chlorendic, polyazelaic, polyadipic, and polysebasic anhydrides. The corresponding diacids of the aforementioned anhydrides may also be used. The anhydride to epoxy ratio is also important and may be varied from 0.5:1 to 1.5:1. The preferred range of anhydride to epoxy ratio is between 0.6:1 and 0.8:1. This preferred range results in optimum electrical and mechanical properties of the composite.

The prior art bendable laminate composite as described hereinabove suffers from two deficiencies. First, plated through hole (PTH) reliability is limited due to the high Z-axis (thickness) thermal expansion coefficient (CTE) of the composite above Tg (25-50° C.). The CTE of the composite above Tg is 300-400 PPM/° C. This high CTE limits the double sided applications which require plated through holes. The second problem is the potential melting and blistering of the polyester fibers during solder reflow or wave solder operations especially when the molten solder is above the recommended temperature. The melting and fusion of the polyester fibers results in embrittlement of the composite and lower PTH reliability.

In accordance with a first embodiment of the present invention, the problem of high Z-axis CTE is alleviated by adding low CTE inorganic particles or fibers to the resin formulation. As a result of the inorganic filler, the CTE in the Z direction of the overall composite material will be about 100-300 ppm/°C. Examples of inorganic low CTE particles include, but are not limited to clays or mineral fillers such as wollastonite, diatomaceous earth, mica, beta-eucryptite, silica, glass beads or spheres, milled glass fibers, milled mineral fibers, quartz fibers or particles, alumina fibers or particles, and calcium sulfate fibers. In order to obtain maximum benefit in CTE while maintaining processability of the composite, the loading levels (weight % of the resin fraction of the composite including the filler) of the fillers should be in the range of 20-70% (40-50% preferred). The use of coupling agents such as 3-aminopropyl-triethoxysilane or 3-glicidyloxypropyl-trimethoxysilane may be used to: (a) modify the mechanical properties of the composite (depending on whether the coupling agent is reactive or inert), (b) decrease moisture absorption, (c) improve dimensional stability.

In accordance with a second embodiment of the present invention, the potential problem of melting polyester fibers is overcome by replacing these low temperature ($T_m=255°$ C.) fibers with organic fibers which have a higher thermal stability (preferably higher than 260° C.) Examples of higher thermal stability fibers include, but are not limited to aromatic polyamide (NOMEX, KEVLAR); phenolic, poly(acrylonitrile), polyester (KODEL), poly(phenylene sulfide), fluoropolymer (TEFLON), and other liquid crystalline or rigid rod type polymeric fibers.

As in the prior art laminate, the Tg of the epoxy is maintained at or near room temperature so that the Tg is in the range of 10-60° C.; and spreads over a range of 20-30° C. Also, it may be desirable to employ a catalyst- /accelerator to facilitate in forming the composite circuit laminate.

Figure 1:
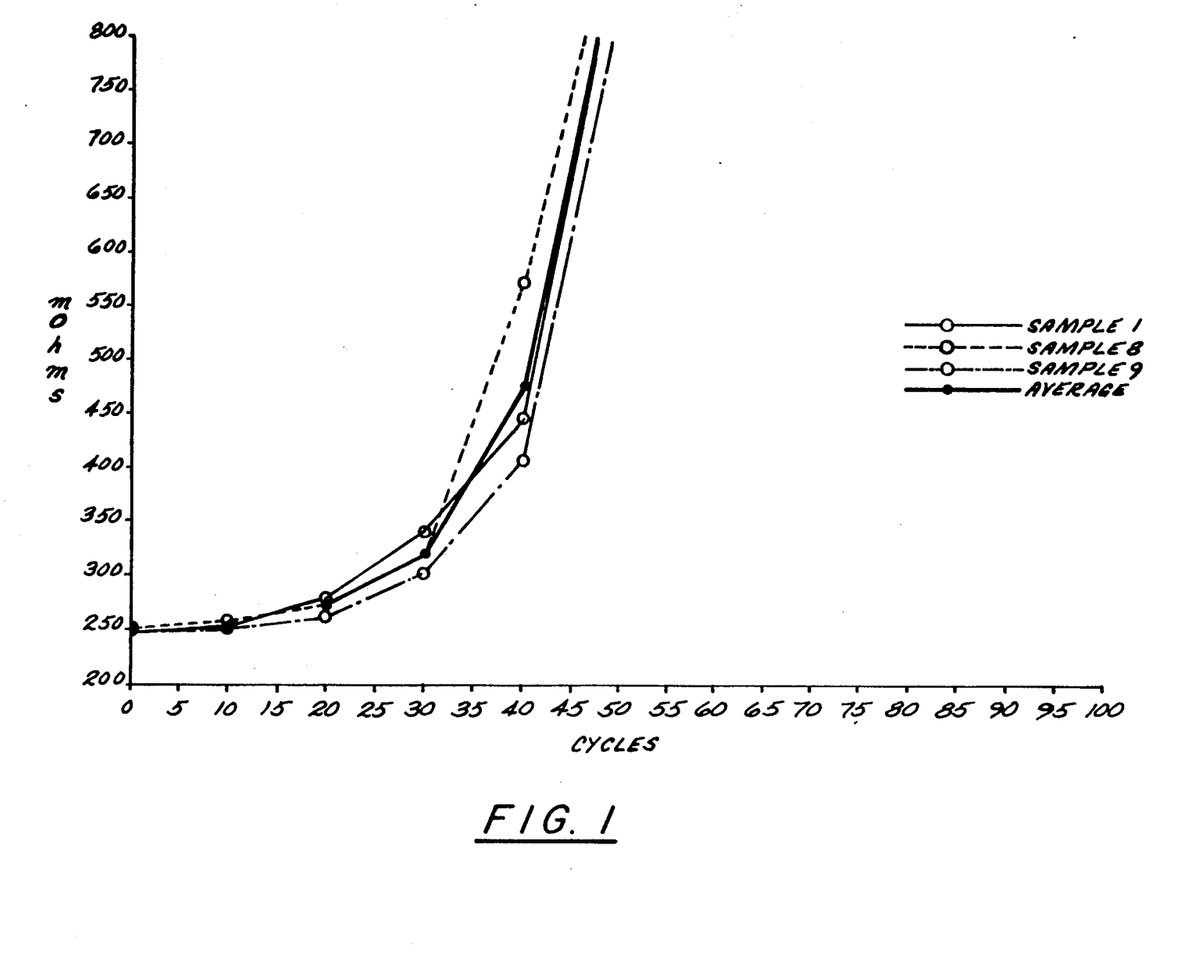
FIG. 1 is a graph showing a thermal cycling test for prior art bendable, shape retaining circuit board material.
Figure 2:
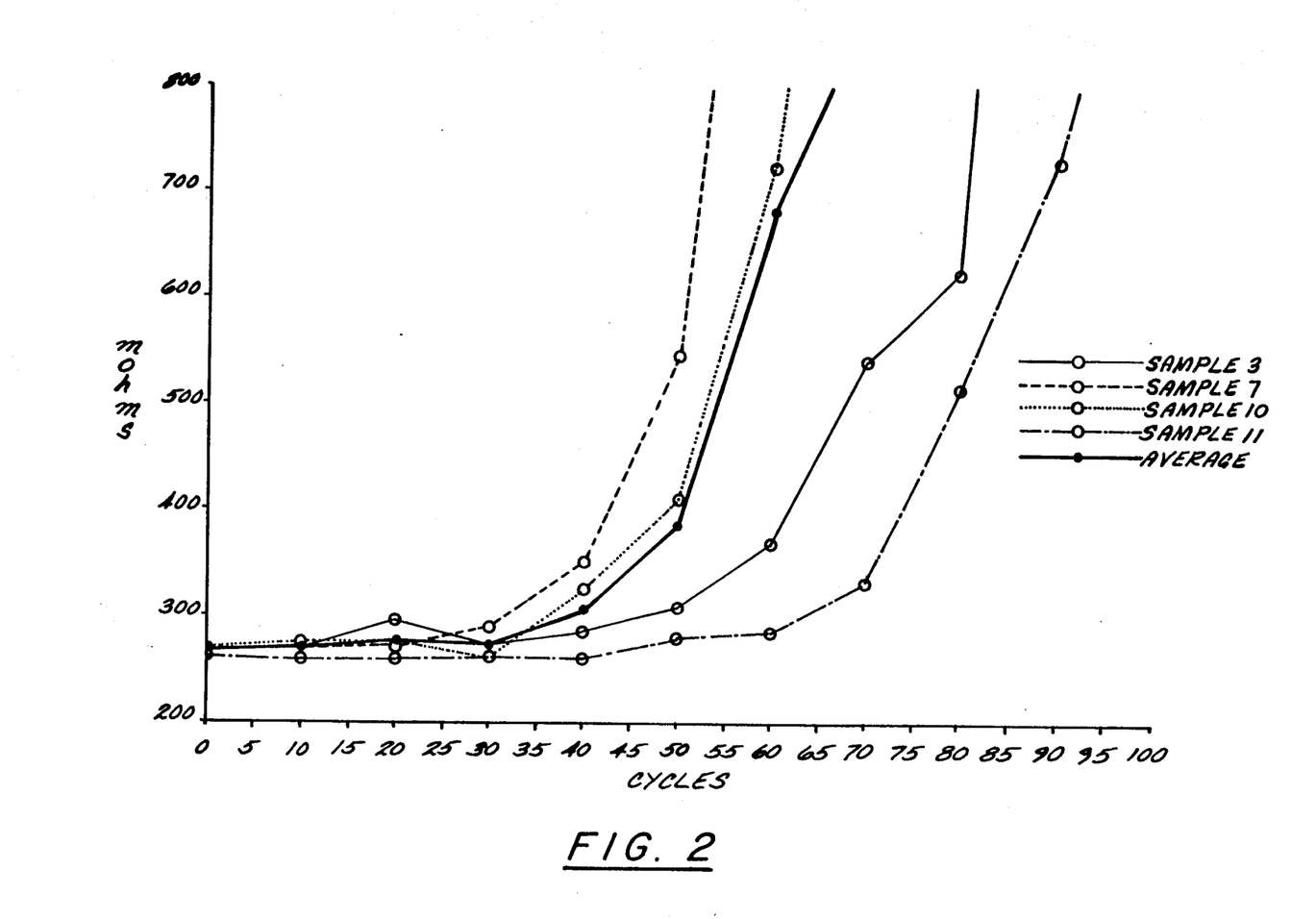
FIG. 2 is a graph showing a thermal cycling test for circuit board material in accordance with a first embodiment of the present invention.
Figure 3:
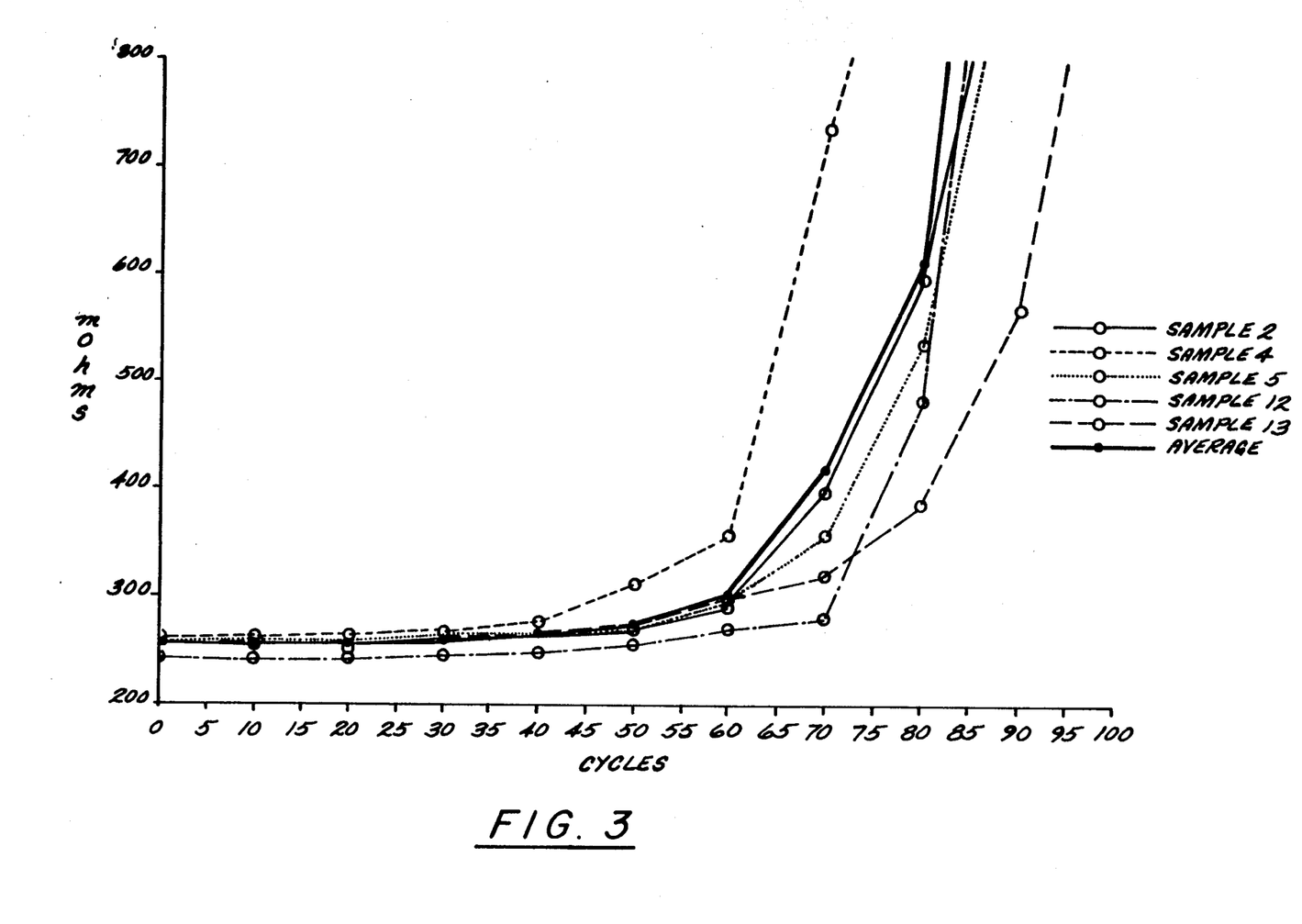
FIG. 3 is a graph showing a thermal cycling test for circuit board material in accordance with a second embodiment of the present invention.
Figure 4:
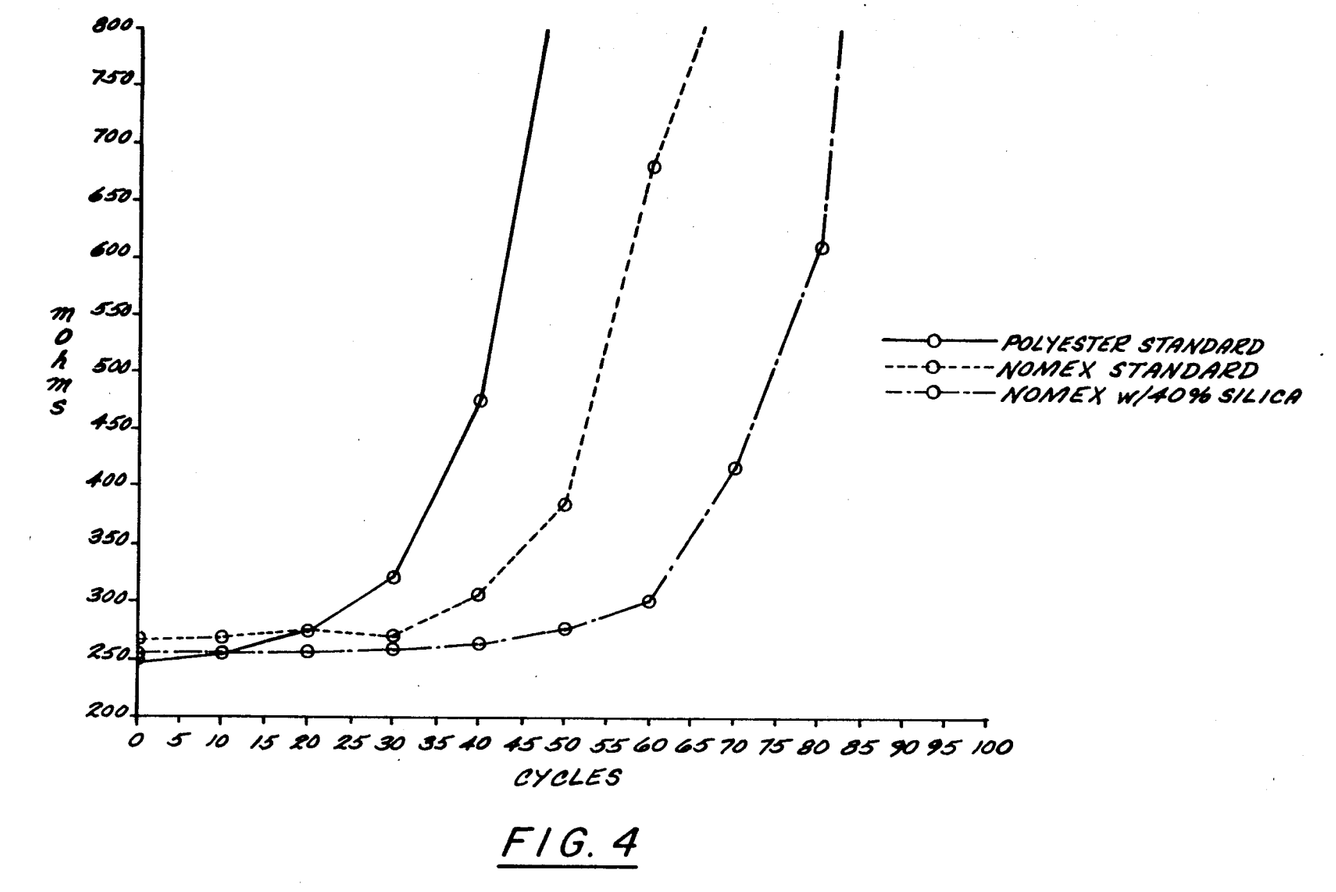
FIG. 4 is an averaged comparison graph of the test data of FIGS. 1, 2 and 3.

Turning now to FIGS. 1-4, thermal cycling test data for the three materials set forth in Table 1 is graphically depicted (FIG. 4 is an averaged comparison of the data of FIGS. 1, 2 and 3). The thermal cycling test was conducted on a circuit board having a daisy chain pattern stringing sixty (60) holes with temperature cycling between 20° C. and 260° C.

TABLE 1

| FIG. | MATERIAL | NUMBER OF CYCLES TO FAILURE |
|---|---|---|
| 1 | Prior Art | 42 |
| 2 | NOMEX Reinforcement in non-woven web | 52 |
| 3 | NOMEX reinforcement and 40% by weight silica | 73 |

As is clear from a comparison of FIGS. 1, 2, 3 and 4, the bendable laminates with NOMEX high temperature fibers significantly improve PTH reliability relative to laminates with polyester non-woven webs. Moreover, the addition of silica (FIG. 3) further improves the performance of the composite which contains the NOMEX non-woven web. In fact, the combination of NOMEX and silica about doubles the reliability of PTH relative to the prior art bendable circuit board of U.S. Ser. No. 678,603.

The following are non-limiting examples of several embodiments of the present invention; all of which were found, subsequent to lamination and curing to be bendable and shape retaining at or near room temperature.

EXAMPLE 1

A mixture of 396g of hexahydrophthalic anhydride, 402g of polyazelaic polyanhydride, and 2020g of a polyfunctional glycidyl ether of phenolic novolac (average functionality of 3.6) were blended at 140° C. for 20-30 minutes. Once a homogenous mixture was obtained, 940g of tetrabromo bisphenol A, 560g of antimony trioxide ($Sb_2O_3$), 1500g of large (50 percentile 5 micron) particle size hydrated aluminum silicate and 1310g of small (50 percentile 0.8 micron) particle size hydrated aluminum silicate were stirred into the mixture of epoxy and anhydrides.

A fiber mixture (2850 grams) containing 40 weight % poly(ethylene terephthalate) (PET) 6 denier x 2" long and 60 weight % 3 denier x 2.0" long PET staple fibers (such as Dacron polyester from DuPont) were blended together on a fiber blender and formed into a nonwoven fabric web. The nonwoven webs could be varied in weight from 2 to 24 ounces/ft² depending on the thickness of the composite laminate desired.

The composite laminate was formed by coating a nonwoven web with the hot resin mixture using a two roll coater. The resin content of the composite was controlled by the distance between the two rolls. Resin to fiber ratio was further controlled by adding a second dry nonwoven web of desired weight. The impregnated nonwoven web was B-staged at 90° C. followed by lamination to 1 ounce/ft² electrodeposited copper. The lamination was carried out at 100-500 psi and 220° C. The resulting composite contained 21-34% polyester fiber by weight with the balance of the composite composed of epoxy, flame retardant fillers and clays (hydrated aluminum silicates).

EXAMPLE 2

| MATERIAL | PARTS BY WEIGHT |
|---|---|
| PAPA | 770 |
| Polyfunctional glycidyl ether of phenolic novolac (average functionality = 2.2) | 800 |
| Diglycidyl ether of tetrabromo bisphenol A | 300 |
| Dibromophenyl glycidyl ether | 431 |
| Antimony trioxide | 333 |
| Glass microspheres, (60 micron maximum size) | 2560 |
| Nonwoven fabric of | |
| 2 denier poly (M-phenylene isothalamide) (e.g., NOMEX) fibers | 1560 |
| H glass fibers | 670 |

The above components were blended in a similar manner to the components for Example 1. The resulting mixture of fillers, epoxies, anhydride and silane was used to saturate the nonwoven web. The saturated nonwoven web was laminated to electrodeposited 1 ounce/ft² copper using similar conditions to Example 1. This process was repeated in the following Examples 3-10.

EXAMPLE 3

| MATERIAL | PARTS BY WEIGHT |
|---|---|
| Polyadipic polyanhydride (PADA) | 330 |
| Triglycidyl ether of para-amino phenol | 416 |
| Dibromophenyl glycidyl ether | 300 |
| Decabromo diphenyl oxide | 150 |
| Antimony trioxide | 260 |
| Silica (maximum particle size = 60 microns) | 1470 |
| Nonwoven fabric of 3 denier PET fibers | 320 |

EXAMPLE 4

| MATERIAL | PARTS BY WEIGHT |
|---|---|
| Azelaic Acid | 340 |
| Polyfunctional glycidyl ether of phenolic novolac (average functionality = 3.6) | 720 |
| Dibromo phenyl glycidyl ether | 640 |
| Antimony trioxide | 240 |
| Silica (10 micron maximum size) | 1900 |
| Nonwoven fabric of | |
| 3 denier acrylic fibers | 410 |
| H glass fibers | 285 |

EXAMPLE 5

| MATERIAL | PARTS BY WEIGHT |
|---|---|
| PAPA | 195 |
| Polyfunctional glycidyl ether of phenolic novolac (average functionality = 3.6) | 247 |
| Dibromo phenyl glycidyl ether | 109 |
| Decabromo diphenyl oxide | 54 |
| Antimony trioxide | 190 |
| Glass microspheres (44 micron maximum size) | 435 |
| Nonwoven fabric of | |
| 2 denier NOMEX fibers | 168 |

-continued

| MATERIAL | PARTS BY WEIGHT |
|---|---|
| H glass fibers | 42 |

EXAMPLE 6

| MATERIAL | PARTS BY WEIGHT |
|---|---|
| Polysebacic polyanhydride (PSPA) | 206 |
| Diglycidyl ether of bisphenol A | 250 |
| Dibromo phenyl glycidyl ether | 110 |
| Antimony trioxide | 95 |
| Glass microspheres (60 micron maximum size) | 675 |
| Nonwoven fabric of 6 denier poly-1,4 cyclohexylene-dimethylene terephthalate (PCDT) | 380 |

EXAMPLE 7

| MATERIAL | PARTS BY WEIGHT |
|---|---|
| PAPA | 195 |
| Diglycidyl ether of bisphenol A | 258 |
| O-cresyl glycidyl ether | 65 |
| Decabromo diphenyl oxide | 108 |
| Antimony trioxide | 165 |
| Silica (30 micron maximum size) | 675 |
| 3-glycidyl oxypropyl trimethoxysilane | 8 |
| Nonwoven fabric of | |
| 3 denier acrylic fibers | 400 |
| H glass fibers | 100 |

EXAMPLE 8

| MATERIAL | PARTS BY WEIGHT |
|---|---|
| Polysebacic polyanhydride | 206 |
| Glycidyl ether of tetraphenylol ethane | 300 |
| Dibromo phenyl glycidyl ether | 109 |
| Antimony trioxide | 75 |
| Silica (60 micron maximum size) | 575 |
| 3-amino oxypropyl trimethoxysilane | 10 |
| Nonwoven fabric of | |
| 3 denier PET fibers | 260 |
| H glass fibers | 170 |

EXAMPLE 9

| MATERIAL | PARTS BY WEIGHT |
|---|---|
| PAPA | 123 |
| Polyfunctional glycidyl ether of brominated phenolic novolac | 372 |
| p-t-butyl phenyl glycidyl ether | 80 |
| Decabromo diphenyl oxide | 54 |
| Antimony trioxide | 55 |
| Glass microspheres (60 micron maximum size) | 200 |
| Nonwoven fabric of 2 denier NOMEX | 280 |

EXAMPLE 10

| MATERIAL | PARTS BY WEIGHT |
|---|---|
| PSPA | 206 |
| Glycidyl ether of para-amino phenol | 247 |
| O-cresyl glycidyl ether | 65 |

-continued

| MATERIAL | PARTS BY WEIGHT |
|---|---|
| Tetrabromo bisphenol A | 225 |
| Antimony trioxide | 120 |
| Silica (30 micron maximum particle size) | 375 |
| 3 glycidyl oxypropyl trimethoxysilane | 30 |
| Nonwoven fabric of | |
| 2 denier NOMEX fibers | 200 |
| H glass fibers | 100 |

EXAMPLE 11

| MATERIAL | PARTS BY WEIGHT |
|---|---|
| PAPA | 209 |
| Polyfunctional glycidyl ether of coupled bisphenol units (average functionality = 8.0) | 373 |
| Dibromo phenyl glycidyl ether | 117 |
| Decabromo diphenyl oxide | 58 |
| Antimony trioxide | 205 |
| Glass microballoons (60 micron maximum particle size) | 285 |
| Nonwoven reinforcement of: | |
| 2 denier Nomex fibers | 218 |
| H glass fibers | 55 |

EXAMPLE 12

| MATERIAL | PARTS BY WEIGHT |
|---|---|
| PAPA | 209 |
| Polyfunctional glycidyl ether of brominated phenolic novolac | 404 |
| Dibromo phenyl glycidyl ether | 117 |
| Antimony trioxide | 210 |
| Glass microspheres (60 micron maximum particle size) | 305 |
| Nonwoven reinforcement of: | |
| 3 denier PET fibers | 240 |
| H glass fibers | 60 |

EXAMPLE 13

| MATERIAL | PARTS BY WEIGHT |
|---|---|
| PAPA | 209 |
| Difunctional glycidyl ether of tetrabromobisphenol A | 188 |
| Dibromo phenyl glycidyl ether | 117 |
| Antimony trioxide | 205 |
| Silica | 465 |
| Nonwoven reinforcement of: | |
| 3 denier PET | 320 |
| H glass fibers | 80 |

EXAMPLE 14

| MATERIAL | PARTS BY WEIGHT |
|---|---|
| Dodecenyl succinic anhydride | 266 |
| Polyfunctional glycidyl ether of phenolic novolac (average functionality of 3.6) | 178 |
| Antimony trioxide | 80 |
| Decabromo diphenyl oxide | 35 |
| Silica | 335 |
| Nonwoven reinforcement of: | |
| 3 denier polyacrylonitrile | 240 |

-continued

| MATERIAL | PARTS BY WEIGHT |
|---|---|
| H glass fibers | 60 |

EXAMPLE 15

| MATERIAL | PARTS BY WEIGHT |
|---|---|
| PAPA | 209 |
| Polyfunctional glycidyl ether of phenolic novolac (average functionality of 3.6) | 265 |
| Polyfunctional glycidyl ether of an aliphatic polyol with a glycidyl ether equivalent weight of approximately 640 | 100 |
| Antimony trioxide | 105 |
| Glass microballoons (60 micron maximum particle size) | 215 |
| Nonwoven reinforcement of: | |
| 2 denier Nomex | 210 |
| H glass fibers | 140 |

EXAMPLE 16

| MATERIAL | PARTS BY WEIGHT |
|---|---|
| PAPA | 209 |
| Polyfunctional glycidyl ether of phenolic novolac (average functionality of 3.6) | 265 |
| Diglycidyl ether of dibromo neopenthyl glycol | 91 |
| Antimony trioxide | 145 |
| Decabromodiphenyl oxide | 45 |
| Glass microspheres (35 micron maximum size) | 535 |
| Nonwoven reinforcement of: | |
| 3 denier PET | 400 |
| H glass fibers | 100 |

EXAMPLE 17

| MATERIAL | PARTS BY WEIGHT |
|---|---|
| PAPA | 209 |
| Tetraglycidyl diamino diphenyl methane | 162 |
| Dibromophenyl glycidyl ether | 115 |
| Antimony trioxide | 120 |
| Decabromo diphenyl oxide | 54 |
| Silica | 260 |
| Nonwoven reinforcement of: | |
| 2 denier Nomex | 210 |
| H glass fibers | 140 |

EXAMPLE 18

| MATERIAL | PARTS BY WEIGHT |
|---|---|
| PAPA | 100 |
| Diglycidyl ether of bisphenol A | 100 |
| Antimony trioxide | 50 |
| Decabromo diphenyl oxide | 27 |
| Silica | 175 |
| Nonwoven reinforcement of: | |
| 2 denier Nomex | 160 |
| H glass fibers | 40 |

EXAMPLE 19

| MATERIAL | PARTS BY WEIGHT |
|---|---|
| Azelaic acid | 448 |
| Polyglycidyl ether of phenolic novolac (average functionality of 3.6) | 850 |
| Decabromo diphenyl oxide | 307 |
| Antimony trioxide | 481 |
| 3-glycidyl oxypropyl trimethoxysilane | 25 |
| Silica | 800 |
| Nonwoven reinforcement of: | |
| 3 denier PET | 600 |
| H glass fibers | 400 |

EXAMPLE 20

| MATERIAL | PARTS BY WEIGHT |
|---|---|
| Azelaic acid | 108 |
| Polyglycidyl ether of phenolic novolac (average functionality of 3.6) | 34 |
| Diglycidyl ether of bisphenol A | 72 |
| Antimony trioxide | 140 |
| Decabromo diphenyl oxide | 75 |
| Glass microspheres | 240 |
| Nonwoven reinforcement of: | |
| 3 denier Nomex | 160 |
| H glass fibers | 40 |

All of the examples included a catalyst/accelerator for increasing the rate of reaction. However, such catalyst/accelerators are not required to make the circuit material composite of this invention.

In accordance with the present invention, the unique combination of components provides a printed circuit board which can be bent and formed into permanent multiplanar shape without cracking or creasing of the substrate or of the copper. The multiplanar bent circuit board will then retain its bent or formed shape when the forming forces are removed therefrom. In general, the bends should be curved (forming distinct radii) since sharp creases may break the copper and/or craze the substrate. The radius should be about ¼ inch for a laminate of 0.015 substrate and 1 oz. copper, and should increase for thicker laminates. Significantly, the bending or forming can be done at room temperature.

The minimum bend radius (R) to dielectric thickness ratio (t) is dependent on the elongation of the laminated copper and the conductor width. Typically, the minimum value of R/t ranges from 5 to 10. For example, when a sample of the present invention having a 0.030" thickness containing 100% of the original one ounce/ft$^2$ copper cladding on both sides is bent at a radius of 0.030" to a bend angle of 50°; the retained angle is 60–80° several hours after the initial bend. The retained angle does not substantially change with time. For a variety of samples made with standard electrodeposited copper foil, cracks first appeared in the copper conductors at a bend ratio (R/t) of 5–8. No cracks or crazes were visible at 50X magnification in the dielectric at these bend ratios.

Thus, as in the prior art circuit material of U.S. Ser. No. 778,603, the forming or bending may be at room temperature, and it may be done manually or by machine. Once the circuit element is formed, it retains its shape, which is of crucial importance to the present invention.

Thus, the printed circuit board of the present invention is a formable or bendable circuit element which essentially combines some of the advantages of both rigid and flexible printed circuit board materials including:

(1) the ability to process in sheet form, which is useful to hardboard manufacturers who conventionally process in this manner;

(2) heavy components may be mounted on the relatively rigid structure without the use of extra stiffeners as are required with conventional flexible printed circuit boards, and may be used with automatic handling machines;

(3) like flexible printed circuit boards, the ability to conform to the shape of the space available and to bend circuitry around corners; and (4) like hardboard, the ability to retain its shape after installation.

It will be appreciated that the present invention is not analogous to a B-staged material. Instead, the present invention may be bent or formed into a multiplanar shape after exposure to circuit processing thermal operations. Exposure to thermal processes such as hot air solder leveling, wave soldering or infrared solder reflow do not substantially change the bendability of the material. A printed circuit board of the present invention is capable of being bent to a bend ratio (R/t) of 10:1 without fracture of the copper conductors or cracking and/or crazing of the dielectric after several excursions to temperatures as high as 288° C..

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A circuit material composite comprising:
   (a) a substrate including;
      a nonwoven web fabric;
      an epoxy resin impregnating said nonwoven web fabric, said epoxy resin having a glass transition in the range of about 10–60° C., said glass transition having a breadth of about 20 to 30° C.;
      filler material in said nonwoven web fabric and epoxy resin, said filler material comprising 20–70% by weight of the total composite and being comprised of inorganic filler-material or fibers wherein the coefficient of thermal expansion in the Z direction for the circuit material composite is in the range of 100–300 ppm/°C.; and
   (b) a layer of conductive material on at least a portion of a surface of said substrate, said composite being flexible in the sense that it can be bent to a desired multiplanar shape and will retain that shape.

2. The composite of claim 1 including:
   at least one silane coupling agent on said filler material.

3. The composite of claim 1 wherein:
   said nonwoven web fabric comprises a blend of glass fibers and polymeric fibers.

4. The composite of claim 3 wherein:
   said polymeric fibers have thermal stability above about 260° C.

5. The composite of claim 3 wherein:
   said polymeric fibers comprise at least one fiber selected from the group consisting of aromatic polyamide, phenolic, poly (acrylonitrile), copolymers of acrylonitrile, polyester, poly (phenylene sulfide) and fluoropolymer.

6. The composite of claim 1 wherein:
   said filler material is selected from the group consisting of clays or mineral fillers.

7. The composite of claim 1 wherein:
   said filler material is selected from the group consisting of wollastonite, diatomaceous earth, mica betaeucryptite, silica, glass microspheres, ground glass microfiber or calcium sulfate.

8. The composite of claim 1 wherein said epoxy resin comprises:
   a multifunctional or difunctional epoxy;
   a monofunctional or aliphatic difunctional flexible epoxy; and
   an anhydride, polyanhydride or diacid.

9. The composite of claim 1 wherein:
   said filler material comprises 40–50% by weight of the total composite material.

10. The composite of claim 1 including:
    a synergistic combination of antimony and brominated compounds for flame retardance.

* * * * *